United States Patent
Liu

(10) Patent No.: US 7,576,618 B2
(45) Date of Patent: Aug. 18, 2009

(54) FREQUENCY SYNTHESIZER WITH A PLURALITY OF FREQUENCY LOCKING CIRCUITS

(75) Inventor: Ren-Chieh Liu, Chang-Hua Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 11/769,697

(22) Filed: Jun. 27, 2007

(65) Prior Publication Data
US 2008/0012620 A1    Jan. 17, 2008

(30) Foreign Application Priority Data
Jun. 28, 2006  (TW) .................................. 95123340

(51) Int. Cl.
*H03B 5/12* (2006.01)
(52) U.S. Cl. ........................... 331/49; 331/56; 327/298; 327/156
(58) Field of Classification Search ...................... 331/2, 331/46, 48, 49, 55, 56; 327/298, 407, 99, 327/156; 455/76, 165.1, 183.1, 260
See application file for complete search history.

(56) References Cited
U.S. PATENT DOCUMENTS

| | | | |
|---|---|---|---|
| 6,463,013 B1 | | 10/2002 | Liu |
| 6,741,109 B1 * | | 5/2004 | Huang et al. ................. 327/156 |
| 2002/0001359 A1 * | 1/2002 | Skierszkan et al. .......... 375/355 |
| 2003/0030475 A1 * | 2/2003 | Ishikawa ..................... 327/291 |
| 2005/0062505 A1 * | 3/2005 | Takahashi .................... 327/99 |
| 2005/0138444 A1 * | 6/2005 | Gaskins ....................... 713/300 |
| 2006/0066376 A1 * | 3/2006 | Narendra et al. ............ 327/292 |
| 2008/0079501 A1 * | 4/2008 | Hulfachor et al. ............ 331/16 |

FOREIGN PATENT DOCUMENTS

TW    460769    10/2001

OTHER PUBLICATIONS

Geum-Young Tak, et al., "A 6.3-9-GHz CMOS Fast Settling PLL for MB-OFDM UWB Applications", IEEE Journal of Solid-State Circuits, vol. 40, No. 8, Aug. 2005, pp. 1671-1679.

* cited by examiner

*Primary Examiner*—Rexford N Barnie
*Assistant Examiner*—Jany Tran
(74) *Attorney, Agent, or Firm*—Winston Hsu

(57) ABSTRACT

The present invention discloses a frequency synthesizer, including: a plurality of frequency locking circuits, for locking a plurality of clock signals to output the clock signals according to a plurality of reference clock signals respectively; a selecting circuit, for selecting a specific clock signal from the clock signals as an output clock signal, wherein a specific frequency locking circuit of the frequency locking circuits locks the specific clock signal; and a control circuit, for controlling the frequency locking circuits. The control circuit controls at least one of the frequency locking circuits apart from the specific frequency locking circuit to lock another clock signal according to another reference clock signal at the same time. A related method for frequency synthesizing is also disclosed.

17 Claims, 4 Drawing Sheets

FREQUENCY SYNTHESIZER WITH A PLURALITY OF FREQUENCY LOCKING CIRCUITS

BACKGROUND OF THE INVENTION

1. Field of the Invention

The present invention relates to a frequency synthesizer, and more particularly relates to a frequency synthesizer with a plurality of frequency locking circuits.

2. Description of the Prior Art

An electronic system or circuit always utilizes a frequency synthesizer to synchronize a system, where the frequency synthesizer always includes a frequency locking circuit such as a PLL to lock a specific signal to a specific frequency. As the system speed increases rapidly, the locking speed of the frequency locking circuit becomes more and more important. The locking speed of the frequency locking circuit is limited by the frequency of a reference clock signal, therefore, the application of this technology to a high speed hopping system is also limited.

SUMMARY OF THE INVENTION

Thus, one objective of the present invention is to provide a frequency synthesizer, which can enlarge the settling time of the frequency locking circuit and decrease power consumption by settling a plurality of frequency locking circuits in the mean time.

Another objective of the present invention is to provide a frequency synthesizer, which controls a plurality of frequency locking circuits to lock signals while decreasing power consumption and system loading.

Still another objective of the present invention is to provide a frequency synthesizer, which has frequency locking circuits corresponding to at least one reference clock signal to increase the flexibility of the system and decrease the circuit area.

The present invention discloses a frequency synthesizer, comprising: a plurality of frequency locking circuits, for locking a plurality of clock signals to output the clock signals according to a plurality of reference clock signals respectively; a selecting circuit, coupled to the frequency locking circuits, for selecting a specific clock signal from the clock signals as an output clock signal, wherein a specific frequency locking circuit of the frequency locking circuits locks the specific clock signal; and a control circuit, coupled to the frequency locking circuits for controlling the frequency locking circuits, wherein the control circuit controls at least one of the frequency locking circuits except for the specific frequency locking circuit to lock another clock signal according to another reference clock signal at the same time. Preferably, the number of the frequency locking circuits is less than the number of the reference clock signals.

The present invention also discloses a frequency synthesizer, comprising: a plurality of frequency locking circuits, for locking a plurality of clock signals to output the clock signals according to a plurality of reference clock signals respectively; a selecting circuit, coupled to the frequency locking circuits, for selecting a first clock signal from the clock signals as an output clock signal, wherein a first frequency locking circuit of the frequency locking circuits locks the first clock signal; and a control circuit, coupled to the frequency locking circuits for controlling the frequency locking circuits, wherein the control circuit controls at least one of the frequency locking circuits apart from the specific frequency locking circuit to lock another clock signal according to another reference clock signal during the selecting circuit selects the first clock signal as the output clock signal The present invention further discloses a method for frequency synthesizing, comprising: locking a plurality of clock signals and outputting the clock signals according to a plurality of reference clock signals; selecting a specific clock signal from the clock signals as an output clock signal; and locking another clock signal according to another reference clock signal during the period of selecting the specific clock signal as the output clock signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
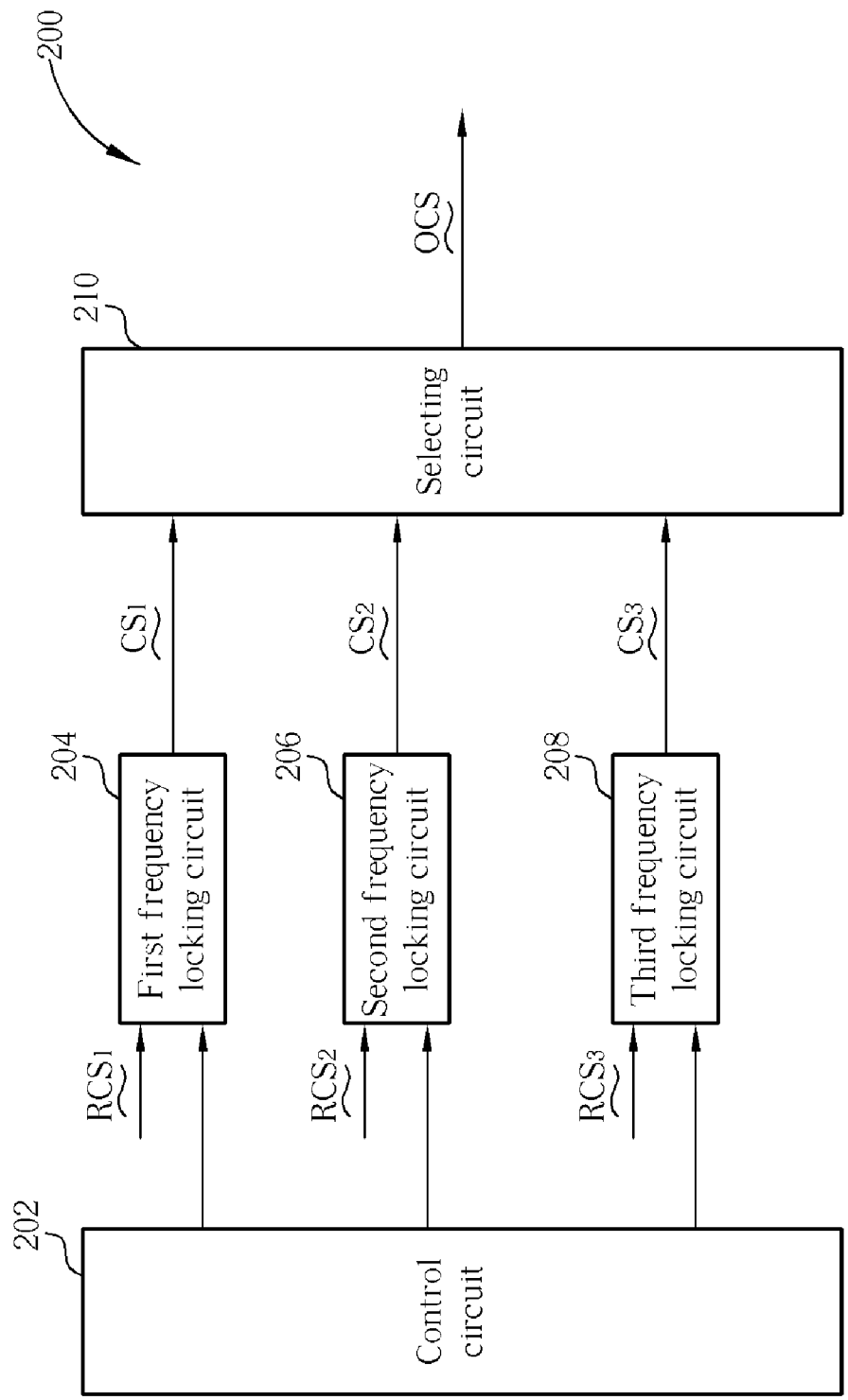
FIG. 1 is a functional block diagram illustrating a frequency synthesizer according to a first embodiment of the present invention.

FIG. 1 is a functional block diagram illustrating a frequency synthesizer 200 according to a first embodiment of the present invention. As shown in FIG. 1, the frequency synthesizer 200 includes a control circuit 202, a first frequency locking circuit 204, a second frequency locking circuit 206, a third frequency locking circuit 208 and a selecting circuit 210. The first frequency locking circuit 204 locks a first clock signal $CS_1$ and outputs the first clock signal $CS_1$ according to a first reference clock signal $RCS_1$. The second frequency locking circuit 206 locks a second clock signal $CS_2$ and outputs the second clock signal $CS_2$ according to a second reference clock signal $RCS_2$. And the third frequency locking circuit 208 locks a second clock signal $CS_3$ and outputs the third clock signal $CS_3$ according to a third reference clock signal $RCS_3$. The selecting circuit 210 selects one of the clock signals $CS_1$, $CS_2$ and $CS_3$ as an output clock signal OCS. The control circuit 202 controls the first frequency locking circuit 204, the second frequency locking circuit 206, and the third frequency locking circuit 208. In this embodiment, the frequency locking circuits are implemented by frequency locking circuits 204, 206 and 208, and the selecting circuit 210 is implemented by a multiplexer. It should be noted that persons skilled in the art can utilize other circuits to reach the same function, and such a modification also falls within the scope of the present invention.

The second frequency locking circuit 206 locks the second clock signal $CS_2$ to the second reference clock signal $RCS_2$ and the third frequency locking circuit 208 operates according to the third reference clock signal $RCS_3$ during the period of the selecting circuit 210 selecting the first clock signal $CS_1$ as the output clock signal OCS. Similarly, the third frequency locking circuit 208 locks the third clock signal $CS_3$ to the third reference clock signal $RCS_3$ during the period of the selecting circuit 210 selecting the second clock signal $CS_2$ as the output clock signal OCS.

Furthermore, each of the frequency locking circuits 204~208 can correspond to more than one reference clock signal during the each locking period. For example, the control circuit 202 controls the second frequency locking circuit 206 to lock the second clock signal $CS_2$ to the second reference clock signal $RCS_2$ gradually while the first clock signal $CS_1$ is locked to the first reference clock signal $RCS_1$ and selected as the output signal OCS. Similarly, the control circuit 202 controls the third frequency locking circuit 208 to lock the third clock signal $CS_3$ to the third reference clock signal $RCS_3$ gradually while the second clock signal $CS_2$ is locked to the second reference clock signal $RCS_2$ and selected as the output signal OCS. After the third clock signal $CS_3$ is locked to the third reference clock signal $RCS_3$, the third clock signal $CS_3$ is selected as the output signal OCS, and the control circuit 202 further controls the first frequency locking circuit 204 such that the first clock signal $CS_1$ is gradually locked to a fourth reference clock signal $RCS_4$ with a frequency different from that of the first reference clock signal $RCS_1$. Thereby a clock signal can be locked to different reference clock signals by a single frequency locking circuit. Furthermore, unnecessary power consumption and loading can be reduced if the frequency locking circuit is turned on only when needed.

It should be noted that the above-mentioned description is not meant to limit the operation of the frequency synthesizer 200. For example, the control circuit 202 can control the second frequency locking circuit 206 to lock the second clock signal $CS_2$ to the second reference clock signal $RCS_2$ gradually. Alternatively, the frequency synthesizer 200 can jointly control the second frequency locking circuit 206 and the third frequency locking circuit 208 to lock the second clock signal $CS_2$ and the third clock signal $CS_3$ to the second reference clock signal $RCS_2$ and the third reference clock signal $RCS_3$ gradually. In other words, the control circuit 202 can control at least one of the frequency locking circuits corresponding to the non-selected clock signals to gradually lock the clock signals to corresponding reference clock signals. The locking time and the number of the clock signals to be locked can be amended according to the demands of a system or a user.

Figure 2:
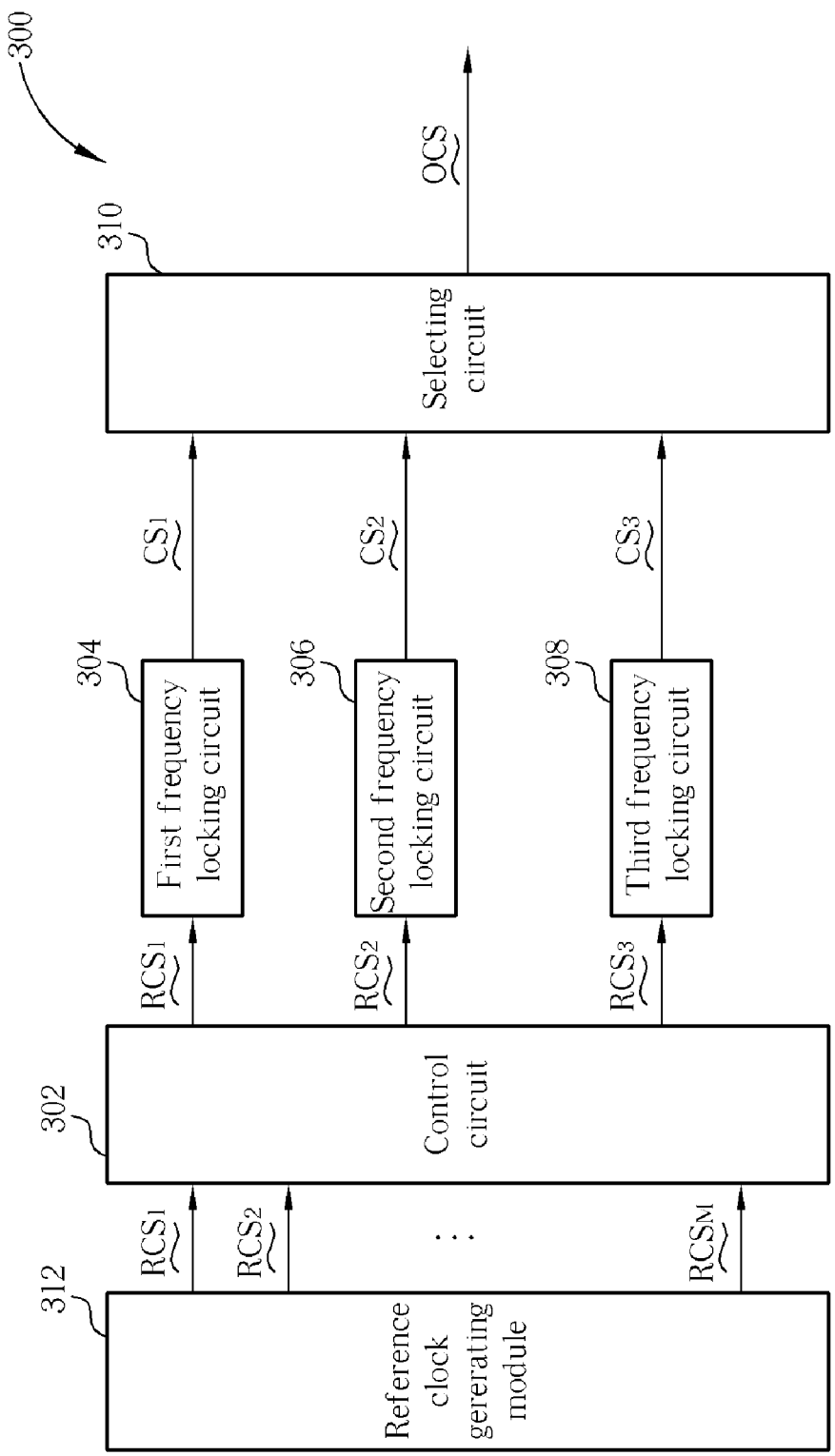
FIG. 2 is a functional block diagram illustrating a frequency synthesizer according to a second embodiment of the present invention.

FIG. 2 is a functional block diagram illustrating a frequency synthesizer 300 according to a second embodiment of the present invention. Similar to the frequency synthesizer 200, the frequency synthesizer 300 also includes a control circuit 302, a first frequency locking circuit 304, a second frequency locking circuit 306, a third frequency locking circuit 308 and a selecting circuit 310. The difference is that the frequency synthesizer 300 further includes a reference clock generating module 312 for outputting M reference clock signals $RCS_1, RCS_2 \ldots RCS_M$ (M>3). In this embodiment, the control circuit 302 not only controls the operation of the first frequency locking circuit 304, the second frequency locking circuit 306, and the third frequency locking circuit 308, but also selects a reference clock signal from M reference clock signals $RCS_1, RCS_2 \ldots RCS_M$ to be outputted to the frequency locking circuits 304~308. The frequency synthesizers 200 and 300 are similar to each other besides the reference clock generating module 312, and thus further description is omitted for brevity. It should be noted that the number of the frequency locking circuits is not limited to three.

Figure 3:
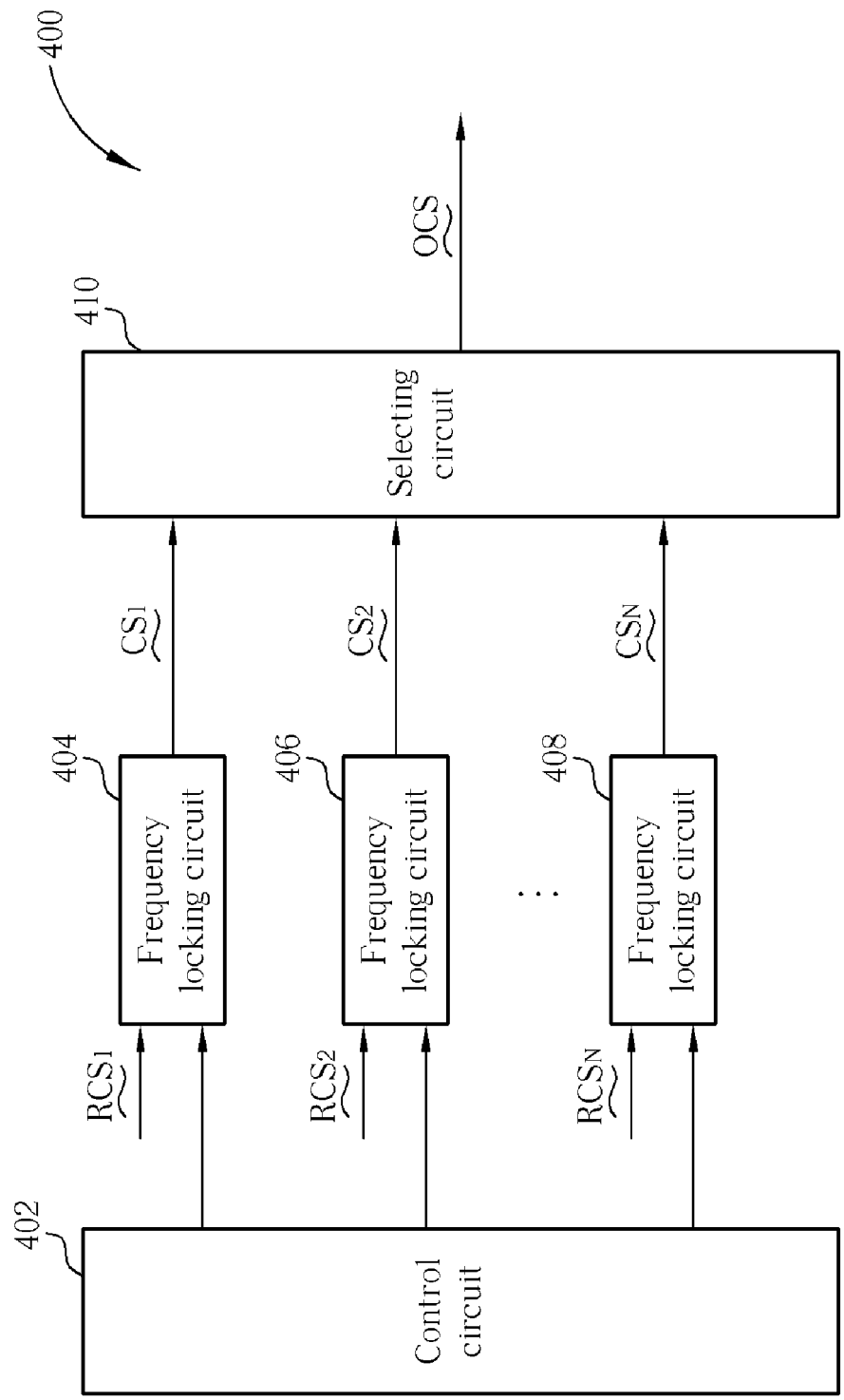
FIG. 3 is a functional block diagram illustrating a frequency synthesizer according to a third embodiment of the present invention.

FIG. 3 is a functional block diagram illustrating a frequency synthesizer 400 according to a third embodiment of the present invention. The frequency synthesizer 400 includes a control circuit 402, N frequency locking circuits 404~408 and a selecting circuit 410. The operation of the control circuit 402, the frequency locking circuits 404~408 and the selecting circuit 410 is the same as that in the first and second embodiments. If the selecting circuit 410 selects one of the clock signals $CS_1, CS_2 \ldots CS_N$ as the output clock signal OCS, the control circuit 402 will control at least one of the frequency locking circuits corresponding to the frequency of non-selected clock signals to gradually lock corresponding clock signals to corresponding reference clock signals. The locking time and the number of the clock signals to be locked can be amended according to requirements.

Figure 4:
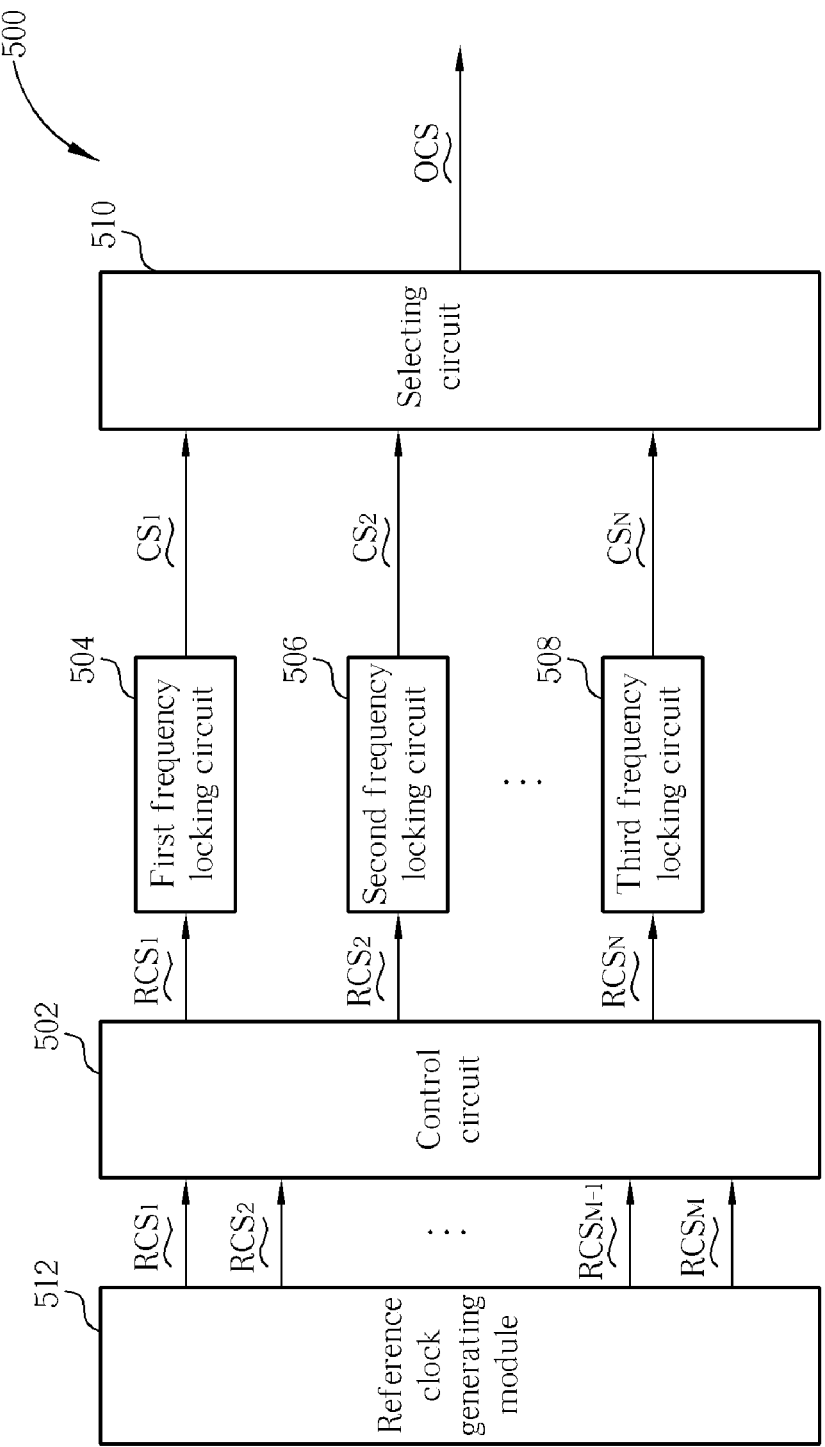
FIG. 4 is a functional block diagram illustrating a frequency synthesizer according to a fourth embodiment of the present invention.

FIG. 4 is a functional block diagram illustrating a frequency synthesizer 500 according to a fourth embodiment of the present invention. Similar to the frequency synthesizer 400, the frequency synthesizer 500 includes a control circuit 502, N frequency locking circuits 504~508 and a selecting circuit 510. The difference is that the frequency synthesizer 500 further includes a reference clock generating module 512 for outputting M reference clock signals $RCS_1, RCS_2 \ldots RCS_M$ (M>N). In this embodiment, the control circuit 502 not only controls the operation of the frequency locking circuits 504~508, but also selects a reference clock signal from M reference clock signals $RCS_1, RCS_2 \ldots RCS_M$ to be outputted to the frequency locking circuits 504~508.

If the retention period of each frequency is tp and the interval is ts, the settling time of the embodiment of the present invention can be enlarged to ts+(N−1) (tp+ts) via utilizing a plurality of frequency locking circuits for settling. Also, the embodiment of the present invention does not need numerous switches to switch the frequency locking circuit, thus the power consumption can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A frequency synthesizer, comprising:
   a plurality of frequency locking circuits, for locking a plurality of clock signals to output the clock signals according to a plurality of different reference clock signals respectively;
   a selecting circuit, coupled to the frequency locking circuits, for selecting a specific clock signal from the clock signals as an output clock signal, wherein a specific frequency locking circuit of the frequency locking circuits locks the specific clock signal according to a variable reference clock signal; and
   a control circuit, coupled to the frequency locking circuits for controlling the frequency locking circuits, wherein the control circuit controls at least one of the frequency locking circuits apart from the specific frequency locking circuit to lock another clock signal according to another reference clock signal during the selecting circuit selects the specific clock signal as the output clock signal.

2. The frequency synthesizer of claim 1, wherein the frequency locking circuits are PLL circuits.

3. The frequency synthesizer of claim 1, further comprising:
a reference clock generating module, for generating the reference clock signals.

4. The frequency synthesizer of claim 3, wherein the number of the frequency locking circuits is less than the number of the reference clock signals from the reference clock generating module.

5. The frequency synthesizer of claim 3, wherein the control circuit is coupled between the reference clock generating module and the frequency locking circuit, for selecting at least one of the reference clock signal for being outputted to the frequency locking circuits.

6. The frequency synthesizer of claim 1, wherein the frequency synthesizer outputs a first clock signal, a second clock signal and a third clock signal, and the frequency locking circuits comprise:
a first frequency locking circuit, for locking the first clock signal according to a first reference clock signal and outputting the first clock signal;
a second frequency locking circuit, for locking the second clock signal according to a second reference clock signal and outputting the second clock signal; and
a third frequency locking circuit, for locking the third clock signal according to a third reference clock signal and outputting the third clock signal.

7. The frequency synthesizer of claim 6, wherein the second frequency locking circuit locks the second clock signal to the second reference clock signal and the third frequency locking circuit operates according to the third reference clock signal during the selecting circuit selects the first clock signal as the output clock signal.

8. The frequency synthesizer of claim 7, wherein the third frequency locking circuit locks the third clock signal to the third reference clock signal during the selecting circuit selects the second clock signal as the output clock signal.

9. The frequency synthesizer of claim 6, wherein the frequency synthesizer outputs a fourth clock signal after outputting the third clock signal, and the first frequency locking circuit operates according to a fourth reference clock signal corresponding to the fourth clock signal after the selecting circuit switches the selection from the first reference clock signal to the second reference clock signal as the output clock signal.

10. The frequency synthesizer of claim 1, wherein the selecting circuit is a multiplexer.

11. A frequency synthesizer, comprising:
a plurality of frequency locking circuits, for locking a plurality of clock signals to output the clock signals according to a plurality of different reference clock signals respectively;
a selecting circuit, coupled to the frequency locking circuits, for selecting a first clock signal from the clock signals as an output clock signal, wherein a first frequency locking circuit of the frequency locking circuits locks the first clock signal according to a variable reference clock signal; and
a control circuit, coupled to the frequency locking circuits for controlling the frequency locking circuits, wherein the control circuit controls at least one of the frequency locking circuits apart from the first frequency locking circuit to lock another clock signal according to another reference clock signal during the selecting circuit selects the first clock signal as the output clock signal.

12. A method for frequency synthesizing, comprising:
controlling a plurality of frequency locking circuits to lock a plurality of clock signals and output the clock signals according to a plurality of different reference clock signals, wherein at least one of the reference clock signals is variable;
selecting a specific clock signal from the clock signals as an output clock signal; and
controlling one of the frequency locking circuits apart from the specific clock signal to lock another clock signal according to another reference clock signal during selecting the specific clock signal as the output clock signal.

13. The method of claim 12, further comprising generating and outputting the reference clock signals.

14. The method of claim 12, further comprising selecting at least one reference clock signal from the outputted reference clock signals.

15. The method of claim 12, further comprising:
outputting a first clock signal, a second clock signal and a third clock signal;
locking the first clock signal according to a first reference clock signal and outputting the first clock signal;
locking the second clock signal according to a second reference clock signal and outputting the second clock signal; and
locking the third clock signal according to a third reference clock signal and outputting the third clock signal.

16. The method of claim 15, further comprising:
locking the second clock signal to the second reference clock signal and locking the third clock signal to the third reference clock signal during selecting the first clock signal as the output clock signal.

17. The method of claim 15, further comprising:
outputting a fourth clock signal and locking the first clock signal according to the fourth reference clock signal corresponding to the fourth clock signal after switching the selection from the first reference clock signal to the second reference clock signal as the output clock signal.

* * * * *